United States Patent
Ho et al.

(10) Patent No.: US 6,790,374 B1
(45) Date of Patent: Sep. 14, 2004

(54) PLASMA ETCH METHOD FOR FORMING PLASMA ETCHED SILICON LAYER

(75) Inventors: Kwok Keung Paul Ho, Singapore (SG); Xuechun Dai, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/442,499

(22) Filed: Nov. 18, 1999

(51) Int. Cl.⁷ .................................... H01L 21/302
(52) U.S. Cl. .................... 216/37; 216/79; 438/719; 134/1.1; 134/1.2; 134/21
(58) Field of Search .................. 134/1.1, 1.2, 21, 134/22.1; 438/719, 905; 216/37, 79

(56) References Cited

U.S. PATENT DOCUMENTS

| | | | |
|---|---|---|---|
| 5,431,772 A | 7/1995 | Babie et al. | 156/643.1 |
| 5,456,796 A | 10/1995 | Gupta et al. | 156/643.1 |
| 5,681,424 A | 10/1997 | Saito et al. | 156/643.1 |
| 5,705,080 A | 1/1998 | Leung et al. | 216/67 |
| 5,811,356 A | 9/1998 | Murugesh et al. | 438/711 |
| 5,824,375 A | 10/1998 | Gupta | 427/569 |
| 6,090,718 A * | 7/2000 | Soga et al. | 438/714 |
| 6,139,702 A * | 10/2000 | Yang et al. | 204/192.37 |
| 6,267,121 B1 * | 7/2001 | Huang et al. | 134/1.1 |
| 6,274,500 B1 * | 8/2001 | Xuechun et al. | 438/706 |
| 6,325,948 B1 * | 12/2001 | Chen et al. | 216/67 |
| 6,440,858 B1 * | 8/2002 | Canale et al. | 438/700 |

FOREIGN PATENT DOCUMENTS

| | | |
|---|---|---|
| EP | 0272143 | 12/1987 |
| JP | 09-082690 | * 3/1971 |
| JP | 07-201814 | * 8/1995 |
| JP | 07-263408 | * 10/1995 |
| JP | 08-255786 | * 10/1996 |

OTHER PUBLICATIONS

"Deep Trench Process Performance Enhancements in an MRIE Reactor"; Sue et. al.; (1993),—Proc of SPIE; vol. 1803; pp. 55–67.*

* cited by examiner

Primary Examiner—George A. Goudreau
(74) Attorney, Agent, or Firm—George O. Saile; Rosemary L. S. Pike; Stephen G. Stanton (57) ABSTRACT

A method for forming an etched silicon layer. There is first provided a first substrate having formed thereover a first silicon layer. There is then etched the first silicon layer to form an etched first silicon layer while employing a plasma etch method employing a plasma reactor chamber in conjunction with a plasma etchant gas composition which upon plasma activation provides at least one of an active bromine containing etchant species and an active chlorine containing etchant species. Within the plasma etch method: (1) a cleaned plasma reactor chamber is seasoned to provide a seasoned plasma reactor chamber having a seasoning polymer layer formed therein; (2) the first silicon layer is etched to form the etched first silicon layer within the seasoned plasma reactor chamber; and (3) the seasoning polymer layer is cleaned from the seasoned plasma reactor chamber to provide the cleaned plasma reactor chamber after etching the first silicon layer to form the etched first silicon layer within the seasoned plasma reactor chamber, prior to etching a second silicon layer to form an etched second silicon layer formed over a second substrate within the plasma reactor chamber while employing the plasma etch method in accord with (1), (2) and (3).

21 Claims, 2 Drawing Sheets

PLASMA ETCH METHOD FOR FORMING PLASMA ETCHED SILICON LAYER

BACKGROUND OF THE INVENTION

1. Field of the Invention

The present invention relates generally to methods for forming etched silicon layers within microelectronic fabrications. More particularly, the present invention relates to plasma etch methods for forming with attenuated plasma etch residue plasma etched silicon layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become more common in the art of microelectronic fabrication to employ plasma etch methods for forming etched silicon layers, including but not limited to etched monocrystalline silicon layers, etched polycrystalline silicon layers and etched amorphous silicon layers, within microelectronic fabrications.

Such plasma etch methods often employ plasma etchant gas compositions which upon plasma activation provide active bromine and/or chlorine containing etchant species, such as may be derived, for example and without limitation, from etchant gases including but not limited to bromine, hydrogen bromide, chlorine and/or hydrogen chloride. Similarly, such etched silicon layers formed within microelectronic fabrications may include, but are not limited to: (1) partially etched monocrystalline silicon semiconductor substrate layers having shallow and/or deep isolation and/or capacitive trenches etched therein as employed within semiconductor integrated circuit microelectronic fabrications, as well as; (2) fully etched and patterned polycrystalline silicon non-substrate layers which may be employed as: (a) patterned polysilicon conductor layers within microelectronic fabrications including but not limited to semiconductor integrated circuit microelectronic fabrications, as well as; (b) gate electrodes within field effect transistors (FETs) employed within semiconductor integrated circuit microelectronic fabrications.

Similarly, such etched silicon layers when formed within microelectronic fabrications while employing plasma etch methods which employ etchant gas compositions which upon plasma activation provide active bromine and/or chlorine containing etchant species are often formed in the presence of silicon containing dielectric layers, such as but not limited to silicon oxide dielectric layers, silicon nitride dielectric layers and silicon oxynitride dielectric layers. The silicon containing dielectric layers may be formed as plasma etch mask hard mask patterned silicon containing dielectric layers, or in the alternative as substrate layers, such as, for example and without limitation, as gate dielectric silicon containing dielectric layers formed beneath gate electrodes formed within field effect transistors (FETs) employed within semiconductor integrated circuit microelectronic fabrications.

While plasma etch methods for forming etched silicon layers for use within microelectronic fabrications are thus desirable and common within the art of microelectronic fabrication, plasma etch methods for forming etched silicon layers for use within microelectronic fabrications are nonetheless not entirely without problems in the art of microelectronic fabrication. In that regard, it is known in the art of microelectronic fabrication that: (1) it is often difficult to reproducibly and controllably form while employing plasma etch methods etched silicon layers with attenuated residue formation (such as but not limited to attenuated particulate contamination residue formation) within microelectronic fabrications; and (2) in situations where the etched silicon layers are formed in the presence of silicon containing dielectric layers, it is often difficult to reproducibly and controllably form the etched silicon layers with enhanced selectivity of the plasma etch methods for the etched silicon layers with respect to the silicon containing dielectric layers.

It is thus towards the goal of providing for use when fabricating microelectronic fabrications plasma etch methods for reproducibly and controllably forming within microelectronic fabrications etched silicon layers with: (1) attenuated residue formation (such as but not limited to particulate contamination residue formation); and (2) enhanced selectivity of the plasma etch methods for the etched silicon layers with respect to silicon containing dielectric layers when those etched silicon layers are formed in the presence of silicon containing dielectric layers, that the present invention is directed.

Various plasma processing methods have been disclosed in the art of microelectronic fabrication for forming plasma processed microelectronic layers with desirable properties within microelectronic fabrications.

For example, Gupta et al., in U.S. Pat. No. 5,456,796, discloses a plasma processing method for attenuating particulate generation and deposition upon a substrate employed within a microelectronic fabrication when processing the substrate employed within the microelectronic fabrication while employing the plasma processing method. The plasma processing method employs: (1) a rapid increase of a plasma power within a plasma reactor chamber to a high plasma power level prior to introduction of the substrate into a plasma reactor chamber to thus provide for effective cleaning of the plasma reactor chamber prior to introduction of the substrate into the plasma reactor chamber, in conjunction with; (2) a slower increase of the plasma power within the plasma reactor chamber subsequent to introduction of the substrate into the plasma reactor chamber in order to avoid circulation of particles within the plasma reactor chamber which would otherwise settle upon the substrate.

In addition, Saito et al., in U.S. Pat. No. 5,681,424, disclose a plasma processing method for cleaning a plasma reactor chamber within which is plasma etched a silicon layer formed over a substrate while employing a hydrogen bromide containing etchant gas composition, while simultaneously dissipating an electrostatic charge formed upon the substrate incident to use within a plasma apparatus employed within the plasma processing method of an electrostatic chuck for securing the substrate within the plasma reactor chamber. The plasma processing method employs an oxygen containing etchant gas composition for simultaneously cleaning the reactor chamber and dissipating the electrostatic charge formed upon the substrate.

Further, Leung et al., in U.S. Pat. No. 5,705,080, disclose a plasma processing method for cleaning deposits from within a reactor chamber, including but not limited to a plasma reactor chamber, without damaging within the reactor chamber reactor components which are otherwise sensitive to the plasma processing method. The plasma processing method employs covering within the reactor chamber components which are otherwise sensitive to the plasma processing method prior to cleaning the deposits from within the reactor chamber while employing the plasma processing method.

Still further, Murugesh et al., in U.S. Pat. No. 5,811,356, disclose a plasma processing method and a plasma processing apparatus which provide for a reduced concentration of mobile ions and metal contaminants within a reactor chamber so that there may be fabricated within the reactor chamber microelectronic layers, particularly microelectronic dielectric layers, with enhanced reliability. The method employs, when seasoning the reactor chamber while employing the plasma processing method and the plasma processing apparatus, a bias radio frequency power density of greater than 0.051 watts per square millimeter and a seasoning time of greater than about 30 seconds.

Finally, Gupta, in U.S. Pat. No. 5,824,375, discloses a plasma processing method and a plasma processing apparatus for reducing fluorine and other sorbable contaminants in a plasma reactor chamber employed within a chemical vapor deposition (CVD) method, such as but not limited to a plasma enhanced chemical vapor deposition (PECVD) method. The plasma processing method and the plasma processing apparatus employ an inert plasma treatment of the plasma reactor chamber after cleaning the plasma reactor chamber while employing a fluorine containing plasma etch method and prior to forming within the plasma reactor chamber while employing a plasma deposition method a passivating seasoning layer within the plasma reactor chamber.

Desirable in the art of microelectronic fabrication are additional plasma etch methods and materials which may be employed for reproducibly and controllably forming with attenuated residue etched silicon layers within microelectronic fabrications with enhanced selectivity of the plasma etch methods for the etched silicon layers with respect to silicon containing dielectric layers when the etched silicon layers are formed in the presence of silicon containing dielectric layers.

It is towards the foregoing objects that the present invention is directed.

SUMMARY OF TEE INVENTION

A first object of the present invention is to provide a plasma etch method for reproducibly and controllably forming an etched silicon layer within a microelectronic fabrication.

A second object of the present invention is to provide a plasma etch method in accord with the first object of the present invention, where the etched silicon layer is reproducibly and controllably formed with attenuated residue (such as but not limited to particulate contamination residue).

A third object of the present invention is to provide a plasma etch method in accord with the first object of the present invention and the second object of the present invention, where the plasma etch method reproducibly and controllably exhibits enhanced selectivity for the etched silicon layer with respect to a silicon containing dielectric layer when the etched silicon layer is formed in the presence of the silicon containing dielectric layer within the microelectronic fabrication.

A fourth object of the present invention is to provide a method in accord with the first object of the present invention, the second object of the present invention and the third object of the present invention, which method is readily commercially implemented.

In accord with the objects of the present invention, there is provided a plasma etch method for forming an etched silicon layer. To practice the method of the present invention, there is first provided a first substrate having formed thereover a first silicon layer. There is then etched the first silicon layer to form an etched first silicon layer while employing a plasma etch method employing a plasma reactor chamber in conjunction with a plasma etchant gas composition which upon plasma activation provides at least one of an active bromine containing etchant species and an active chlorine containing etchant species, wherein within the plasma etch method: (1) a cleaned plasma reactor chamber is seasoned to provide a seasoned plasma reactor chamber having a seasoning polymer layer formed therein; (2) the first silicon layer is etched to form the etched first silicon layer within the seasoned plasma reactor chamber; and (3) the seasoning polymer layer is cleaned from the seasoned plasma reactor chamber to provide the cleaned plasma reactor chamber after etching the first silicon layer to form the etched first silicon layer within the seasoned plasma reactor chamber, prior to etching a second silicon layer to form an etched second silicon layer formed over a second substrate within cleaned plasma reactor chamber while employing the plasma etch method in accord with (1), (2) and (3).

The present invention provides a plasma etch method for reproducibly and controllably forming an etched silicon layer within a microelectronic fabrication, where the etched silicon layer is formed with attenuated residue (such as but not limited to particulate residue) and where the plasma etch method exhibits enhanced selectivity for the etched silicon layer with respect to a silicon containing dielectric layer when the etched silicon layer is formed in the presence of the silicon containing dielectric layer within the microelectronic fabrication. The present invention realizes the foregoing objects by employing within the present invention: (1) a cleaned plasma reactor chamber seasoning to provide a seasoned plasma reactor chamber having a seasoning polymer layer formed therein; (2) a single substrate silicon layer etching within the seasoned plasma reactor chamber; and (3) a cleaning of the seasoning polymer layer from the seasoned plasma reactor chamber to provide the cleaned plasma reactor chamber, prior to etching a second silicon layer to form an etched second silicon layer formed over a second substrate while employing the preceding steps (1), (2) and (3).

The method of the present invention is readily commercially implemented. The present invention employs an apparatus which is generally conventional in the art of microelectronic fabrication. Since it is a process control and materials selection which provides at least in part the present invention, rather than the existence of methods and apparatus which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a plasma etch method for reproducibly and controllably forming an etched silicon layer within a microelectronic fabrication, where the etched silicon layer is formed with attenuated residue (such as but not limited to particulate contamination residue) and where the plasma etch method exhibits enhanced selectivity for the etched silicon layer with respect to a silicon containing dielectric layer when the etched silicon layer is formed in the presence of the silicon containing dielectric layer within the microelectronic fabrication. The method of the present invention realizes the foregoing objects by employing within the plasma etch method: (1) a seasoning of a cleaned plasma reactor chamber to form a seasoned plasma reactor chamber having a seasoning polymer layer formed therein; (2) a single substrate silicon layer etching within the seasoned plasma reactor chamber; and (3) a cleaning of the seasoning polymer layer from the seasoned plasma reactor chamber to provide the cleaned plasma reactor chamber, prior to etching a second silicon layer to form an etched second silicon layer formed over a second substrate while employing the preceding steps (1), (2) and (3).

The plasma etch method of the present invention may be employed for forming from silicon layers including but not limited to monocrystalline silicon layers, polycrystalline silicon layers and amorphous silicon layers etched silicon layers including but not limited to etched monocrystalline silicon layers, etched polycrystalline silicon layers and etched amorphous silicon layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
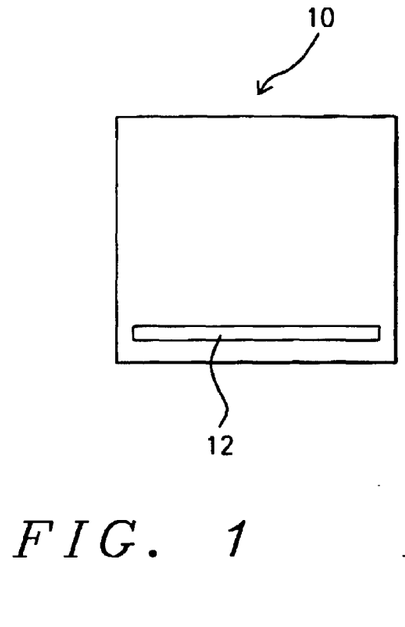
FIG. 1, FIG. 2, FIG. 3 and FIG. 4 show a series of schematic cross-sectional diagrams of a plasma reactor chamber at progressive stages within a plasma etch method in accord with the present invention.

Referring now to FIG. 1 to FIG. 4, there is shown a series schematic cross-sectional diagrams illustrating a plasma reactor chamber at progressive stages within a plasma etch method in accord with the present invention. Shown in FIG. 1 is a schematic cross-sectional diagram of the plasma reactor chamber at an early stage in practice of the plasma etch method of the present invention.

Shown in FIG. 1 is a cleaned plasma reactor chamber 10 having fabricated therein a platen 12. As is understood by a person skilled in the art, plasma reactor chambers are available in any of several types, sizes and configurations as are needed and desirable to plasma process any of several types of substrates as are employed within various types of microelectronic fabrications. Various of such types, sizes and configurations of plasma reactor chambers are disclosed within the various references cited within the Description of the Related Art, the disclosures of which references are incorporated herein fully by reference. As is similarly understood by a person skilled in the art, the platen 12 as illustrated within the schematic cross-sectional diagram of FIG. 1 is sized appropriately to accommodate a substrate employed within a microelectronic fabrication which is fabricated employing the plasma etch method of the present invention.

Figure 2:
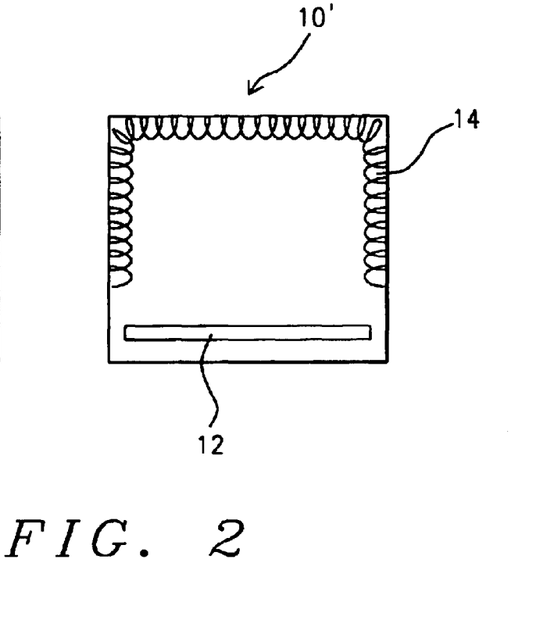

Referring now to FIG. 2, there is shown a schematic cross-sectional diagram illustrating a plasma reactor chamber at a further stage within the plasma etch method in accord with the present invention.

Shown in FIG. 2 is a plasma reactor chamber otherwise equivalent to the cleaned plasma reactor chamber 10 whose schematic cross-sectional diagram is illustrated in FIG. 1, but wherein there is formed upon interior surfaces of the cleaned plasma reactor chamber 10 a seasoning polymer layer 14, thus forming from the cleaned plasma reactor chamber 10 a seasoned plasma reactor chamber 10'. Within the preferred embodiment of the present invention, the seasoning polymer layer 14 is typically and preferably formed of a seasoning polymer material selected from the group including but not limited to: (1) a silicon and bromine containing seasoning polymer material; (2) a silicon, bromine and oxygen containing seasoning polymer material; (3) a silicon and chlorine seasoning polymer material, (4) a silicon, chlorine and oxygen containing seasoning polymer material; (5) a silicon, bromine and chlorine seasoning polymer material; and (6) a silicon, bromine, chlorine and oxygen seasoning polymer material.

Within the preferred embodiment of the present invention, the seasoning polymer layer 14 may be formed employing any one of at least three seasoning polymer layer formation methods.

The first of the at least three seasoning polymer layer formation methods is a dummy wafer seasoning polymer layer formation method which employs in the alternative: (1) a silicon oxide coated dummy wafer in conjunction with a seasoning plasma etch method employing at least one of a bromine containing etchant gas and a chlorine containing etchant gas; (2) a silicon oxide coated dummy wafer in conjunction with a seasoning plasma etch method employing at least one of a bromine containing etchant gas and a chlorine containing etchant gas, in addition to an oxygen containing etchant gas; and (3) a silicon dummy wafer in conjunction with a seasoning plasma etch method employing at least one of a bromine containing etchant gas and a chlorine containing etchant gas, in addition to an oxygen containing etchant gas. Within the preferred embodiment of the present invention, the bromine containing etchant gas is typically and preferably selected from the group consisting of hydrogen bromide and bromine, while the chlorine containing etchant gas is typically and preferably selected from the group consisting of hydrogen chloride and chlorine. Similarly, within the preferred embodiment of the present invention, the oxygen containing etchant gas is typically and preferably selected from the group consisting of oxygen, ozone, nitrous oxide and nitric oxide. Most typically and preferably, the bromine containing etchant gas is hydrogen bromide, the chlorine containing etchant gas is chlorine or hydrogen chloride and the oxygen containing etchant gas is oxygen.

Typically and preferably, the dummy wafer seasoning method will employ when forming the seasoning polymer layer 14 within a seasoned plasma reactor chamber 10' employed for plasma processing an eight inch diameter substrate: (1) a plasma reactor chamber 10 pressure of from about 1 to about 500 mtorr; (2) a source radio frequency power of from about 10 to about 2000 watts at a source radio frequency of from 2 MHz to 13.56 MHZ, and an external bias power of up to about 500 watts; (3) a plasma reactor chamber 10 temperature and a dummy wafer temperature of from about 20 to about 200 degrees centigrade; (4) a bromine and/or chlorine containing etchant gas flow rate of from about 10 to about 200 standard cubic centimeters per minute (sccm); (5) an oxygen containing etchant gas flow rate of from about 1 to about 50 standard cubic centimeters per minute (sccm); (6) a backside cooling gas, typically and preferably but not exclusively helium, at a pressure of from about 1 to about 50 torr and a flowrate of from about 2 to about 50 standard cubic centimeters per minute (sccm); (7) a magnetic field of up to about 200 gauss; and (8) a plasma seasoning time of from about 5 to about 120 seconds.

The second of the at least three seasoning polymer layer formation methods is an in-situ seasoning polymer layer formation method wherein a product substrate having formed exposed thereover a silicon layer, or a silicon layer in the presence of a silicon containing dielectric layer, such as but not limited to a silicon oxide dielectric layer, a silicon nitride dielectric layer or a silicon oxynitride dielectric layer, is plasma etched at a comparatively lower plasma power and a comparatively higher reactor chamber pressure to form the seasoning polymer layer 14 within the seasoned reactor chamber 10' while not damaging the product substrate. Under such circumstances when employing an in-situ seasoning method, there is employed: (1) a silicon containing seasoning polymer layer forming gas; (2) at least one of a bromine containing seasoning polymer layer forming gas and a chlorine containing seasoning polymer layer forming gas; and (3) an optional oxygen containing seasoning polymer layer forming gas, where the latter two seasoning polymer layer forming gases are provided in accord with choices for the bromine and/or chlorine containing etchant gas and the oxygen containing etchant gas as disclosed above as employed within the dummy wafer seasoning polymer layer formation method. The silicon containing seasoning polymer layer forming gas may be selected from the group including but not limited to silicon bromide (which may also serve as a bromine containing seasoning polymer layer forming gas), silicon tetrachloride (which may also serve as a chlorine containing seasoning polymer layer forming gas) and silane.

Typically and preferably, the in-situ seasoning polymer layer forming method will employ when forming the seasoning polymer layer 14 within a seasoned plasma reactor chamber 10' employed for plasma processing an eight inch diameter substrate: (1) a plasma reactor chamber pressure of from about 50 to about 1000 mtorr; (2) a radio frequency source power of from about 10 to about 1000 watts at a source radio frequency of from 2 MHZ to 13.56 MHZ, without an external bias source; (3) a plasma reactor chamber 10 and product substrate temperature of from about 20 to about 200 degrees centigrade; (4) a silicon containing seasoning polymer layer forming gas flow rate of from about 1 to about 200 standard cubic centimeters per minute (sccm); (5) a bromine and/or chlorine containing seasoning polymer layer forming gas flow rate of from about 10 to about 200 standard cubic centimeters per minute (sccm); (6) an optional oxygen containing seasoning polymer layer forming gas flow rate of from about 1 to about 50 standard cubic centimeters per minute (sccm); (7) a backside cooling gas, typically and preferably but not exclusively helium, at a pressure of from about 1 to about 50 torr and a flowrate of from about 2 to about 50 standard cubic centimeters per minute (sccm); (8) a magnetic field of up to about 200 gauss; and (9) a plasma seasoning time of from about 5 to about 120 seconds.

Finally, within the preferred embodiment of the present invention the third of the at least three seasoning polymer layer forming methods is a waferless seasoning polymer layer forming method which employs a seasoning polymer layer forming gas composition employing deposition parameters and limits as employed for the in-situ seasoning polymer layer forming method, as above, but without the presence of the product substrate, or any other substrate, within the cleaned plasma reactor chamber 10.

Within the preferred embodiment of the present invention there may additionally be employed within any of the foregoing three seasoning polymer layer forming methods an optional fluorine containing etchant gas/seasoning gas, such as but not limited to a nitrogen trifluoride fluorine containing etchant gas/seasoning gas or a sulfur hexafluoride fluorine containing etchant gas/seasoning gas, but not a fluorocarbon containing etchant gas/seasoning gas, at a flow rate of from about 1 to about 100 standard cubic centimeters per minute, more preferably from about 1 to about 20 standard cubic centimeters per minute (sccm). Similarly, and in particular with respect to the waferless seasoning polymer layer forming method, it may also be desirable within the present invention to employ within the cleaned plasma reactor chamber 10 a ceramic chuck, rather than a polyimide coated chuck, in order to avoid attack of a polyimide layer formed upon the polyimide coated chuck by the plasma seasoning polymer layer forming methods.

Figure 3:
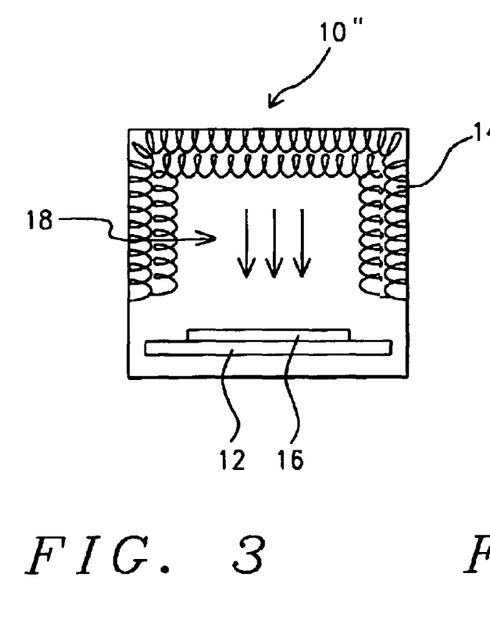

Referring now to FIG. 3, there is shown a schematic cross-sectional diagram illustrating a plasma reactor chamber at a further stage in the plasma etch method in accord with the present invention.

Shown in FIG. 3 is a plasma reactor chamber otherwise equivalent to the seasoned plasma reactor chamber 10' as illustrated within the schematic cross-sectional diagram of FIG. 2, but wherein there is positioned upon the platen 12 a substrate 16 which is etched within a silicon layer etch plasma 18 which simultaneously supplements the seasoning polymer layer 14 to form a supplemented seasoning polymer layer 14' within a supplementally seasoned plasma reactor chamber 10".

Although not specifically illustrated within the schematic cross-sectional diagram of FIG. 3, the substrate 16 has formed thereover a silicon layer which is etched to form an etched silicon layer within the silicon layer etch plasma 18. The silicon layer may be formed from a silicon material selected from the group consisting of monocrystalline silicon materials, polycrystalline silicon materials and amorphous silicon materials. Typically and preferably, although not exclusively, the silicon layer will be masked with a mask layer which may be formed from a silicon containing hard mask dielectric material, such as but not limited to a silicon oxide hard mask dielectric material, a silicon nitride hard mask dielectric material or a silicon oxynitride hard mask dielectric material, or in the alternative a photoresist mask material, although photoresist mask materials are not preferred since they may either add carbon to the supplemented seasoning polymer layer 14', or in the alternative add various contaminants to the substrate 16. Similarly, the silicon layer will often be formed in the presence of a silicon containing dielectric layer, which if not employed for forming the hard mask layer may otherwise be in contact with the silicon layer, such as, for example and without limitation as formed immediately beneath the silicon layer.

Within the preferred embodiment of the present invention with respect to the silicon layer etch plasma 18, the silicon layer etch plasma 18 typically and preferably employs an etchant gas composition which upon plasma activation forms at least one of an active bromine containing etchant species and an active chlorine containing etchant species (such as may be formed from an etchant gas including but not limited to hydrogen bromide, bromine, hydrogen chloride and/or chlorine), along with an optional oxygen containing etchant species (such as but not limited to oxygen, ozone, nitrous oxide or nitric oxide) and an optional fluorine containing etchant species (such as but not limited to nitrogen trifluoride and sulfur hexafluoride). More preferably, the silicon layer etch plasma 18 employs an etchant gas composition comprising hydrogen bromide, oxygen and nitrogen trifluoride.

When etching a silicon layer to form an etched silicon layer over an eight inch diameter substrate 16 within the supplementally seasoned plasma reactor chamber 10" as illustrated within the schematic cross-sectional diagram of FIG. 3, the silicon layer etch plasma 18 also employs: (1) a reactor chamber pressure of from about 1 to about 500 mtorr, (2) a radio frequency source power of from about 10 to about 2000 watts at a source radio frequency of from 2 MHz to 13.56 MHz and an external bias power of up to about 500 watts; (3) a substrate 16 and supplementally seasoned plasma reactor chamber 10" temperature of from about 20 to about 200 degrees centigrade; (4) a hydrogen bromide flow rate of from about 10 to about 200 standard cubic centimeters per minute (sccm); (5) an oxygen flow rate of from about 1 to about 50 standard cubic centimeters per minute (sccm); (6) a nitrogen trifluoride flow rate of from about 1 to about 50 standard cubic centimeters per minute (sccm); (7) a backside cooling gas, typically and preferably but not exclusively helium, at a pressure of from about 1 to about 50 torr and a flowrate of from about 2 to about 50 standard cubic centimeters per minute (sccm); and (8) a magnetic field of up to about 200 gauss.

Figure 4:
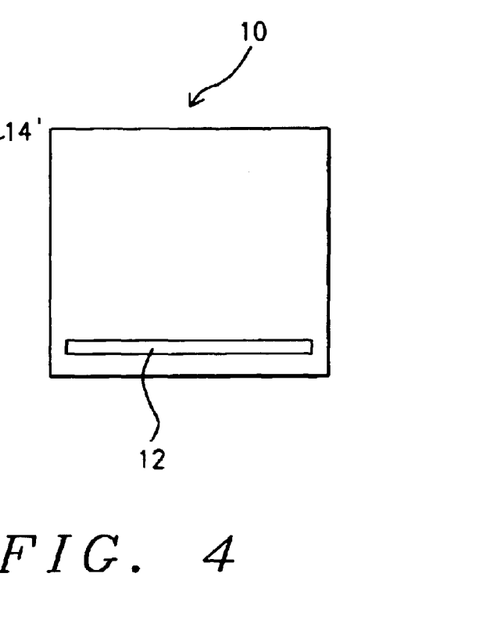

Referring now to FIG. 4, there is shown a schematic cross-sectional diagram illustrating a plasma reactor chamber at a further stage within the plasma etch method in accord with the present invention.

Shown in FIG. 4 is a schematic cross-sectional diagram of a plasma reactor chamber otherwise equivalent to the supplementally seasoned plasma reactor chamber 10" whose schematic cross-sectional diagram is illustrated in FIG. 3, but wherein the plasma reactor chamber has been cleaned of the supplemented seasoning polymer layer 14' and returned to a condition equivalent, although not necessarily identical, to the condition of the cleaned plasma reactor chamber 10 as illustrated within the schematic cross-sectional diagram of FIG. 1.

To thus strip from within the supplementally seasoned plasma reactor chamber 10" as illustrated within the schematic cross-sectional diagram of FIG. 3 the supplemented seasoning polymer layer 14' to provide the cleaned plasma reactor chamber 10 whose schematic cross-sectional diagram is illustrated in FIG. 4 and FIG. 1, there is typically and preferably employed a plasma stripping method, typically and preferably employing an etchant gas composition which upon plasma activation provides an active fluorine containing etchant species. More typically and preferably, the etchant gas composition employs at least one of nitrogen trifluoride and sulfur hexafluoride, and preferably not a fluorocarbon etchant gas.

When stripping the supplemented seasoning polymer layer 14' from within the supplementally seasoned plasma reactor chamber 10" which is employed in processing an eight inch diameter substrate 16, the plasma stripping method also employs: (1) a supplementally seasoned plasma reactor chamber 10" pressure of from about 50 to about 500 mtorr; (2) a source radio frequency of from about 100 to about 2000 watts at a source radio frequency of 2 MHZ to 13.56 MHZ, and a bias power of up to about 500 watts; (3) a supplementally seasoned plasma reactor chamber 10" temperature of from about 20 to about 200 degrees centigrade; (4) a nitrogen trifluoride or a sulfur hexafluoride flow rate of from about 10 to about 500 standard cubic centimeters per minute (sccm); (5) a backside cooling gas, typically and preferably but not exclusively helium, at a pressure of from about 1 to about 50 torr and a flowrate of from about 2 to about 50 standard cubic centimeters per minute (sccm); and (6) a magnetic field of up to about 200 gauss.

Although not specifically illustrated within the schematic cross-sectional diagram of FIG. 4, the plasma stripping method may also optionally employ a dummy wafer. Similarly, and in particular when a dummy wafer is not employed within the plasma stripping method, it may also be desirable within the present invention to employ within the supplementally seasoned plasma reactor chamber 10" a ceramic chuck, rather than a polyimide coated chuck, in order to avoid attack of a polyimide layer formed upon the polyimide coated chuck by the plasma stripping method.

Upon stripping from the supplementally seasoned plasma reactor chamber 10" the supplemented seasoning polymer layer 14' as illustrated within the schematic cross-sectional diagram of FIG. 3 to provide the cleaned reactor chamber 10 as illustrated within the schematic cross-sectional diagram of FIG. 4, there is provided a cleaned reactor chamber within which may be processed a second substrate in accord with a process flow in accord with FIG. 1, FIG. 2 and FIG. 3, where the second substrate has formed thereover a second silicon layer which is etched to form an etched second silicon layer.

By employing within the method of the present invention a plasma reactor chamber seasoning, a silicon layer etching and a plasma reactor chamber cleaning for each single substrate fabricated within the plasma reactor chambers as illustrated within the schematic cross-sectional diagrams of FIG. 1 to FIG. 4, there is reproducibly and controllably provided with an enhanced uniformity an etched silicon layer formed over the substrate 16, where the etched silicon layer is reproducibly and controllably formed with an attenuated residue (such as particulate contamination residue) formed upon .the etched silicon layer formed over the substrate 16 and an attenuated etching of a silicon containing dielectric layer formed in the presence of the etched silicon layer.

Figure 5:
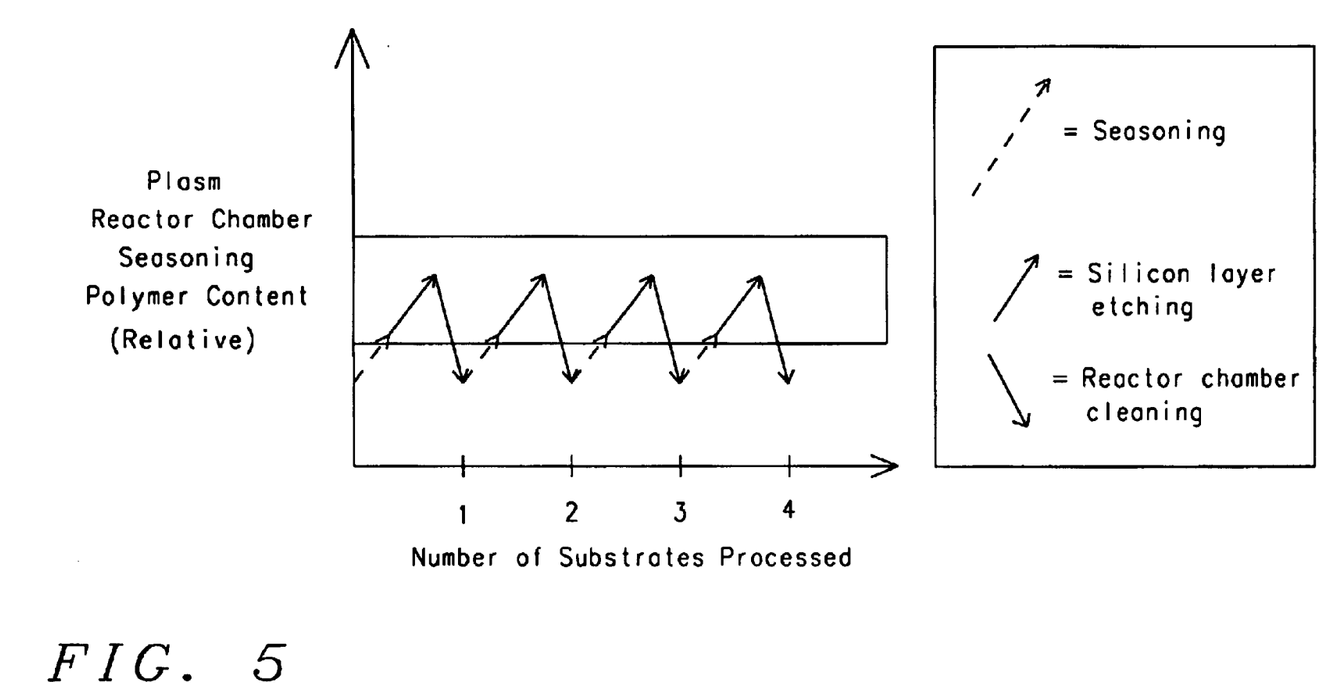
FIG. 5 shows a plot of Plasma Reactor Chamber Seasoning Polymer Content versus Number of Substrates Processed, for a series of substrates processed within a plasma reactor chamber in accord with the present invention.

Referring now to FIG. 5, there is shown a graph of Plasma Reactor Chamber Seasoning Polymer Content versus Number of Substrates Processed for a plasma reactor chamber in accord with the preferred embodiment of the present invention. As is illustrated by the legend which accompanies FIG. 5, there is shown within FIG. 5 by means of the dashed upwardly pointing arrows a portion of the process of the present invention which is directed towards forming the seasoning polymer layer within the seasoned plasma reactor chamber. Similarly, in conjunction with the seasoning polymer layer there is shown by addition of the solid upwardly pointing arrows the supplemented seasoning polymer layer content within the supplementally seasoned reactor chamber. Finally, there is shown by the downwardly pointed arrows the results of cleaning the reactor chamber of the present invention to remove therefrom the supplemented seasoning polymer layer.

As is similarly also illustrated within the graph of FIG. 5 there is a shaded target range for seasoning polymer content within which it is desired to operate the plasma reactor chamber while employing the method of the present invention. Above the shaded range of seasoning polymer content the thickness of seasoning polymer layer becomes sufficiently thick such that it is believed that flaking occurs and contributes to particulate contamination upon a substrate over which is formed a silicon layer which is etched within the plasma reactor chamber. Similarly, under conditions where the seasoning polymer layer is formed within the plasma reactor chamber of a content less than a minimal requisite content, there is observed a loss in selectivity for etching of the silicon layer formed over the substrate with respect to a silicon containing dielectric layer also formed over the substrate.

As is understood by a person skilled in the art, although: (1) the cleaned reactor chamber 10 as illustrated within the schematic cross-sectional diagram of FIG. 1 is disclosed as equivalent, although not necessarily identical, to the cleaned reactor chamber 10 as illustrated within the schematic cross-sectional diagram of FIG. 4; and (2) it is typical and preferred within the present invention that the cleaned plasma reactor chamber 10 as illustrated within the schematic cross-sectional diagram of FIG. 1 be formed employing the plasma stripping method as employed for forming the cleaned reactor chamber 10 as illustrated within the schematic cross-sectional diagram of FIG. 4 from the supplementally seasoned plasma reactor chamber 10'' as illustrated within the schematic cross-sectional diagram of FIG. 3, when initiating the method of the present invention, the cleaned reactor chamber 10 as illustrated within the schematic cross-sectional diagram of FIG. 1 may initially be formed employing alternative methods to assure its cleanliness, including but not limited to other plasma stripping methods and plasma conditioning methods.

Similarly, as is understood by a person skilled in the art, although the present invention is disclosed within the context of a multi-cycle seasoning/etching/cleaning method for reproducibly and controllably forming a series of etched silicon layers with desirable properties over a series of substrates employed within a microelectronic fabrication, the method of the present invention may alternatively equivalently be disclosed and claimed as a multi-cycle cleaning/seasoning/etching method, or alternatively to a lesser extent as a multi-cycle etching/cleaning/seasoning method, for forming an identical series of etched silicon layers with the desirable properties over an identical series of substrates, since the present invention provides a multi-cycle method where the particular starting point for describing the method may be arbitrarily chosen.

Finally, as is understood by a person skilled in the art, the preferred embodiment of the present invention is illustrative of the present invention rather than limiting of the present invention. Revisions and modifications may be made to methods, materials, structures and dimensions through which is provided an etched silicon layer within a microelectronic fabrication in accord with the preferred embodiment of the present invention, while still providing an etched silicon layer within a microelectronic fabrication in accord with the present invention, in accord with the accompanying claims.

What is claimed is:

1. A method for forming an etched silicon layer comprising:

providing a first substrate having formed thereover a first silicon layer;

etching the first silicon layer to form an etched first silicon layer while employing a plasma etch method employing a plasma reactor chamber in conjunction with a plasma etchant gas composition which upon plasma activation provides at least one of an active bromine containing etchant species and an active chlorine containing etchant species, wherein within the plasma etch method:

(1) a cleaned plasma reactor chamber is seasoned to provide a seasoned plasma reactor chamber having a seasoning polymer layer formed therein; wherein the seasoning method is a waferless seasoning method employing:

(a) a silicon containing seasoning polymer layer forming gas; and (b) a bromine and/or chlorine containing etchant gas;

(2) the first silicon layer is etched to form the etched first silicon layer within the seasoned plasma reactor chamber; wherein the first silicon layer etch step, when using an eight inch diameter substrate, employs:

a reactor chamber pressure of from about 1 to 500 mTorr;

a radio frequency source power of from about 10 to 2000 watts at a source radio frequency of from about 2 to 13.56 MHz and an external bias power of up to about 500 watts;

a substrate temperature and a seasoned plasma reactor chamber temperature of from about 20 to 200° C.;

a bromine and/or chlorine containing etchant gas flow rate of from about 10 to 200 sccm;

an oxygen flow rate of from about 1 to 50 sccm;

a nitrogen trifluoride flow rate of from about 1 to 50 sccm;

a backside cooling gas pressure of from about 1 to 50 torr and a flow rate of from about 2 to 50 sccm; and a magnetic field of up to about 200 gauss; and (3) the seasoning polymer layer is cleaned from the seasoned plasma reactor chamber to provide the cleaned plasma reactor chamber after etching the first silicon layer to form the etched first silicon layer within the seasoned plasma reactor chamber prior to etching a second substrate having formed thereover a second silicon layer to form an etched second silicon layer formed over the second substrate within the plasma reactor chamber while employing the plasma etch method in accord with (1), (2) and (3).

2. A method for forming an etched monocrystalline silicon layer comprising:

providing a first substrate having formed thereover a first monocrystalline silicon layer;

etching the first monocrystalline silicon layer to form an etched first monocrystalline silicon layer while employing a plasma etch method employing a plasma reactor chamber in conjunction with a plasma etchant gas composition which upon plasma activation provides at least one of an active bromine containing etchant species and an active chlorine containing etchant species, wherein within the plasma etch method:

(1) a cleaned plasma reactor chamber is seasoned to provide a seasoned plasma reactor chamber having a seasoning polymer layer formed therein; wherein the seasoning method is a waferless seasoning method employing:

(a) a silicon containing seasoning polymer layer forming gas; and (b) a bromine and/or chlorine containing etchant gas;

(2) the first monocrystalline silicon layer is etched to form the etched first monocrystalline silicon layer within the seasoned plasma reactor chamber;

wherein the first monocrystalline silicon layer etch step, when using an eight inch diameter substrate, employs:

a reactor chamber pressure of from about 1 to 500 mTorr;

a radio frequency source power of from about 10 to 2000 watts at a source radio frequency of from about 2 to 13.56 MHz and an external bias power of up to about 500 watts;

a substrate temperature and a seasoned plasma reactor chamber temperature of from about 20 to 200° C.;

a bromine and/or chlorine containing etchant gas flow rate of from about 10 to 200 sccm;

an oxygen flow rate of from about 1 to 50 sccm;

a nitrogen trifluoride flow rate of from about 1 to 50 sccm;

a backside cooling gas pressure of from about 1 to 50 torr and a flow rate of from about 2 to 50 sccm; and a magnetic field of up to about 200 gauss; and (3) the seasoning polymer layer is cleaned from the seasoned plasma reactor chamber to provide the cleaned plasma reactor chamber after etching the first monocrystalline silicon layer to form the etched first monocrystalline silicon layer within the seasoned plasma reactor chamber prior to etching a second substrate having formed thereover a second monocrystalline silicon layer to form an etched second monocrystalline silicon layer formed over the second substrate within the plasma reactor chamber while employing the plasma etch method in accord with (1), (2) and (3).

3. A method for forming an etched polycrystalline silicon layer comprising:

providing a first substrate having formed thereover a first polycrystalline silicon layer;

etching the first polycrystalline silicon layer to form an etched first polycrystalline silicon layer while employing a plasma etch method employing a plasma reactor chamber in conjunction with a plasma etchant gas composition which upon plasma activation provides an active bromine containing etchant species, wherein within the plasma etch method:

(1) a cleaned plasma reactor chamber is seasoned to provide a seasoned plasma reactor chamber having a seasoning polymer layer formed therein; wherein the seasoning method is a waferless seasoning method employing:

(a) a silicon containing seasoning polymer layer forming gas; and (b) a bromine and/or chlorine containing etchant gas;

(2) the first polycrystalline silicon layer is etched to form the etched first polycrystalline silicon layer within the seasoned plasma reactor chamber; wherein the first polycrystalline silicon layer etch step, when using an eight inch diameter substrate, employs:

a reactor chamber pressure of from about 1 to 500 mTorr;

a radio frequency source power of from about 10 to 2000 watts at a source radio frequency of from about 2 to 13.56 MHz and an external bias power of up to about 500 watts;

a substrate temperature and a seasoned plasma reactor chamber temperature of from about 20 to 200° C.;

a hydrogen bromide flow rate of from about 10 to 200 sccm;

an oxygen flow rate of from about 1 to 50 sccm;

a nitrogen trifluoride flow rate of from about 1 to 50 sccm;

a backside cooling gas pressure of from about 1 to 50 torr and a flow rate of from about 2 to 50 sccm; and a magnetic field of up to about 200 gauss; and (3) the seasoning polymer layer is cleaned from the seasoned plasma reactor chamber to provide the cleaned plasma reactor chamber after etching the first polycrystalline silicon layer to form the etched first polycrystalline silicon layer within the seasoned plasma reactor chamber prior to etching a second substrate having formed thereover a second polycrystalline silicon layer to form an etched second polycrystalline silicon layer formed over the second substrate within the plasma reactor chamber while employing the plasma etch method in accord with (1), (2) and (3).

4. A method for forming an etched silicon layer comprising:

providing a first substrate having formed thereover a first silicon layer;

etching the first silicon layer to form an etched first silicon layer while employing a plasma etch method employing a plasma reactor chamber in conjunction with a plasma etchant gas composition which upon plasma activation provides at least one of an active bromine containing etchant species and an active chlorine containing etchant species, wherein within the plasma etch method:

(1) a cleaned plasma reactor chamber is seasoned to provide a seasoned plasma reactor chamber having a seasoning polymer layer formed therein; wherein the seasoning method is a waferless seasoning method employing (a) a silicon containing seasoning polymer layer forming gas; and (b) a bromine and/or chlorine containing etchant gas;

(2) the first silicon layer is etched to form the etched first silicon layer within the seasoned plasma reactor chamber; and (3) the seasoning polymer layer is cleaned from the seasoned plasma reactor chamber to provide the cleaned plasma reactor chamber after etching the first silicon layer to form the etched first silicon layer within the seasoned plasma reactor chamber prior to etching a second substrate having formed thereover a second silicon layer to form an etched second silicon layer formed over the second substrate within the plasma reactor chamber while employing the plasma etch method in accord with (1), (2) and (3).

5. A method for forming an etched monocrystalline silicon layer comprising:

providing a first substrate having formed thereover a first monocrystalline silicon layer;

etching the first monocrystalline silicon layer to form an etched first monocrystalline silicon layer while employing a plasma etch method employing a plasma reactor chamber in conjunction with a plasma etchant gas composition which upon plasma activation provides at least one of an active bromine containing etchant species and an active chlorine containing etchant species, wherein within the plasma etch method:

(1) a cleaned plasma reactor chamber is seasoned to provide a seasoned plasma reactor chamber having a seasoning polymer layer formed therein; wherein the seasoning method is a waferless seasoning method employing:

(a) a silicon containing seasoning polymer layer forming gas; and
(b) a bromine and/or chlorine containing etchant gas;
(2) the first monocrystalline silicon layer is etched to form the etched first monocrystalline silicon layer within the seasoned plasma reactor chamber; and
a magnetic field of up to about 200 gauss; and
(3) the seasoning polymer layer is cleaned from the seasoned plasma reactor chamber to provide the cleaned plasma reactor chamber after etching the first monocrystalline silicon layer to form the etched first monocrystalline silicon layer within the seasoned plasma reactor chamber prior to etching a second substrate having formed thereover a second monocrystalline silicon layer to form an etched second monocrystalline silicon layer formed over the second substrate within the plasma reactor chamber while employing the plasma etch method in accord with (1), (2) and (3).

6. A method for forming an etched polycrystalline silicon layer comprising:
providing a first substrate having formed thereover a first polycrystalline silicon layer;
etching the first polycrystalline silicon layer to form an etched first polycrystalline silicon layer while employing a plasma etch method employing a plasma reactor chamber in conjunction with a plasma etchant gas composition which upon plasma activation provides an active bromine containing etchant species, wherein within the plasma etch method:
(1) a cleaned plasma reactor chamber is seasoned to provide a seasoned plasma reactor chamber having a seasoning polymer layer formed therein; wherein the seasoning method is a waferless seasoning method employing:
(a) a silicon containing seasoning polymer layer forming gas; and
(b) a bromine and/or chlorine containing etchant gas;
(2) the first polycrystalline silicon layer is etched to form the etched first polycrystalline silicon layer within the seasoned plasma reactor chamber; and
(3) the seasoning polymer layer is cleaned from the seasoned plasma reactor chamber to provide the cleaned plasma reactor chamber after etching the first polycrystalline silicon layer to form the etched first polycrystalline silicon layer within the seasoned plasma reactor chamber prior to etching a second substrate having formed thereover a second polycrystalline silicon layer to form an etched second polycrystalline silicon layer formed over the second substrate within the plasma reactor chamber while employing the plasma etch method in accord with (1), (2) and (3).

7. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

8. The method of claim 1 wherein the silicon layer is selected from the group consisting of monocrystalline silicon layers, polycrystalline silicon layers and amorphous silicon layers.

9. The method of claim 1 wherein:
upon etching, the silicon layer is masked with a mask layer, and
the mask layer is selected from the group consisting of silicon containing dielectric hard mask layers and photoresist mask layers.

10. The method of claim 1 wherein the seasoning polymer layer is formed of a material selected from the group consisting of:
silicon and bromine containing seasoning polymer materials;
silicon, bromine and oxygen containing seasoning polymer materials;
silicon and chlorine containing seasoning polymer materials;
silicon, chlorine and oxygen containing seasoning polymer materials;
silicon, bromine and chlorine containing seasoning polymer materials; and
silicon, bromine, chlorine and oxygen containing seasoning polymer materials.

11. The method of claim 2 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

12. The method of claim 2 wherein:
upon etching, the first monocrystalline silicon layer is masked with a mask layer; and
the mask layer is selected from the group consisting of silicon containing dielectric hard mask layers and photoresist mask layers.

13. The method of claim 2 wherein the seasoning polymer layer is formed of a material selected from the group consisting of: silicon and bromine containing seasoning polymer materials;
silicon, bromine and oxygen containing seasoning polymer materials;
silicon and chlorine containing seasoning polymer materials;
silicon, chlorine and oxygen containing seasoning polymer materials;
silicon, bromine and chlorine containing seasoning polymer materials; and
silicon, bromine, chlorine and oxygen containing seasoning polymer materials.

14. The method of claim 3 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

15. The method of claim 3 wherein:
upon etching, the polycrystalline silicon layer is masked with a mask layer; and
the mask layer is selected from the group consisting of silicon containing dielectric hard mask layers and photoresist mask layers.

16. The method of claim 3 wherein the seasoning polymer layer is formed of a material selected from the group consisting of:
silicon and bromine containing seasoning polymer materials;

silicon, bromine and oxygen containing seasoning polymer materials;

silicon and chlorine containing seasoning polymer materials;

silicon, chlorine and oxygen containing seasoning polymer materials;

silicon, bromine and chlorine containing seasoning polymer materials; and silicon, bromine, chlorine and oxygen containing seasoning polymer materials.

17. The method of claim 1, wherein the seasoned plasma reactor chamber cleaning step, when using an eight inch diameter substrate, employs:

a seasoned plasma reactor chamber pressure of from about 50 to 500 mTorr;

a source radio frequency power of from about 100 to 200 watts at a source radio frequency of from about 2 to 13.56 MHz and a bias power of up to about 500 watts;

a seasoned plasma reactor chamber temperature of from about 20 to 200° C.;

a nitrogen trifluoride or a sulfur hexafluoride flow rate of from about 10 to 500 sccm;

a backside cooling gas pressure of from about 1 to 50 torr and a flow rate of from about 2 to 50 sccm; and a magnetic field of up to about 200 gauss.

18. The method of claim 2, wherein the seasoned plasma reactor chamber cleaning step, when using an eight inch diameter substrate, employs:

a seasoned plasma reactor chamber pressure of from about 50 to 500 mTorr;

a source radio frequency power of from about 100 to 200 watts at a source radio frequency of from about 2 to 13.56 MHz and a bias power of up to about 500 watts;

a seasoned plasma reactor chamber temperature of from about 20 to 200° C.;

a nitrogen trifluoride or a sulfur hexafluoride flow rate of from about 10 to 500 sccm;

a backside cooling gas pressure of from about 1 to 50 torr and a flow rate of from about 2 to 50 sccm; and a magnetic field of up to about 200 gauss.

19. The method of claim 3, wherein the seasoned plasma reactor chamber cleaning step, when using an eight inch diameter substrate, employs:

a seasoned plasma reactor chamber pressure of from about 50 to 500 mTorr;

a source radio frequency power of from about 100 to 200 watts at a source radio frequency of from about 2 to 13.56 MHz and a bias power of up to about 500 watts;

a seasoned plasma reactor chamber temperature of from about 20 to 200° C.;

a nitrogen trifluoride or a sulfur hexafluoride flow rate of from about 10 to 500 sccm;

a backside cooling gas pressure of from about 1 to 50 torr and a flow rate of from about 2 to 50 sccm; and a magnetic field of up to about 200 gauss.

20. The method of claim 2, wherein the first polycrystalline silicon layer etch step, when using an eight inch diameter substrate, employs a hydrogen bromide flow rate of from about 10 to 200 sccm.

21. The method of claim 3, wherein the first monocrystalline silicon layer etch step, when using an eight inch diameter substrate, employs a hydrogen bromide flow rate of from about 10 to 200 sccm.

* * * * *